United States Patent
Chang et al.

(10) Patent No.: US 9,614,564 B2
(45) Date of Patent: Apr. 4, 2017

(54) HIGH SPEED RECEIVERS CIRCUITS AND METHODS

(71) Applicant: Intel Corporation, Santa Clara, CA (US)

(72) Inventors: Kevin Chang, Tempe, AZ (US); Stefano Giaconi, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/073,943

(22) Filed: Mar. 18, 2016

(65) Prior Publication Data

US 2016/0308566 A1    Oct. 20, 2016

Related U.S. Application Data

(63) Continuation of application No. 14/795,090, filed on Jul. 9, 2015, which is a continuation of application No. 13/727,737, filed on Dec. 27, 2012, now Pat. No. 9,184,957.

(51) Int. Cl.
  *H03F 3/45*   (2006.01)
  *H04B 1/16*   (2006.01)
  *H04B 3/16*   (2006.01)

(52) U.S. Cl.
  CPC ............ *H04B 1/16* (2013.01); *H03F 3/4521* (2013.01); *H04B 3/16* (2013.01); *H03F 2200/378* (2013.01); *H03F 2200/408* (2013.01); *H03F 2203/45081* (2013.01); *H03F 2203/45212* (2013.01)

(58) Field of Classification Search
  CPC .................................................... H03F 3/45

USPC ............................................ 330/253, 302, 9
See application file for complete search history.

(56) References Cited

U.S. PATENT DOCUMENTS

| | | | |
|---|---|---|---|
| 4,862,121 A | 8/1989 | Hochschihld et al. | |
| 5,250,911 A | 10/1993 | Linder et al. | |
| 5,430,765 A * | 7/1995 | Nagahori | H04B 10/6933 330/259 |
| 5,502,297 A | 3/1996 | Sherman | |
| 5,581,212 A | 12/1996 | Huang et al. | |
| 5,714,911 A | 2/1998 | Gilbert et al. | |
| 5,912,587 A | 6/1999 | Mihailovits et al. | |
| 6,288,604 B1 * | 9/2001 | Shih | H03F 3/45183 327/307 |
| 6,710,959 B1 | 3/2004 | Iroaga | |
| 6,750,704 B1 * | 6/2004 | Connell | H03F 3/45753 330/253 |

(Continued)

FOREIGN PATENT DOCUMENTS

| | | |
|---|---|---|
| CN | 101248580 | 8/2008 |
| CN | 101479942 | 7/2009 |

(Continued)

OTHER PUBLICATIONS

Office Action and Search Report for Chinese Patent Application No. 201380062024.3, issued on Apr. 25, 2016.

(Continued)

*Primary Examiner* — Patricia T Nguyen
(74) *Attorney, Agent, or Firm* — Green, Howard & Mughal, LLP

(57) ABSTRACT

The present invention provides GPA embodiments. In some embodiments, a GPA stage with a negative capacitance unit is provided.

26 Claims, 18 Drawing Sheets

(56) References Cited

U.S. PATENT DOCUMENTS

| | | | |
|---|---|---|---|
| 6,914,484 B2 | 7/2005 | Wu | |
| 6,952,240 B2 | 10/2005 | Gower et al. | |
| 6,987,425 B1 | 1/2006 | Sutardja | |
| 7,358,819 B2 | 4/2008 | Rollins | |
| 7,710,159 B2 | 5/2010 | Shinde | |
| 7,961,050 B1 | 6/2011 | Swei et al. | |
| 8,022,779 B2 | 9/2011 | Ayazi et al. | |
| 8,081,033 B2 | 12/2011 | Kim | |
| 8,107,912 B2 | 1/2012 | Tanaka | |
| 8,816,659 B2 | 8/2014 | Kim et al. | |
| 2003/0214868 A1* | 11/2003 | Baker | G11C 7/02 365/207 |
| 2004/0222852 A1 | 11/2004 | Wu | |
| 2005/0277396 A1 | 12/2005 | Pipilos | |
| 2007/0030085 A1 | 2/2007 | Brennan et al. | |
| 2007/0236289 A1* | 10/2007 | Iriguchi | H03F 3/45179 330/253 |
| 2008/0182538 A1 | 7/2008 | Tanaka et al. | |
| 2008/0197943 A1 | 8/2008 | Xu et al. | |
| 2009/0273370 A1 | 11/2009 | Shinde | |
| 2010/0182080 A1 | 7/2010 | Mak et al. | |
| 2010/0259328 A1 | 10/2010 | Giovannotto | |
| 2010/0301940 A1 | 12/2010 | Mole et al. | |
| 2011/0221531 A1 | 9/2011 | Kim et al. | |
| 2012/0075021 A1 | 3/2012 | Takahashi et al. | |
| 2012/0098574 A1 | 4/2012 | Morikawa | |
| 2012/0132789 A1 | 5/2012 | Ricard et al. | |
| 2013/0180867 A1 | 7/2013 | Rosenstein et al. | |
| 2014/0176239 A1* | 6/2014 | Duggal | H03F 3/45744 330/260 |
| 2014/0253235 A1 | 9/2014 | Fujii | |
| 2014/0253236 A1 | 9/2014 | Cheeranthodi et al. | |

FOREIGN PATENT DOCUMENTS

| | | |
|---|---|---|
| CN | 101902203 | 12/2010 |
| CN | 102437823 | 5/2012 |
| TW | 480836 | 3/2002 |
| TW | 201106620 A | 2/2011 |
| WO | 2010082235 | 7/2010 |
| WO | 2014105124 A2 | 7/2014 |
| WO | 2014105214 A3 | 7/2014 |

OTHER PUBLICATIONS

Final Office Action, mailed Aug. 4, 2016, for U.S. Appl. No. 14/795,090.
Non-Final Office Action, mailed Feb. 29, 2016, for U.S. Appl. No. 14/795,090.
Notice of Preliminary Rejection, mailed Jul. 28, 2016, for KR Patent Application No. 10-2015-7012355.
Search Report mailed Jul. 22, 2016, for TW Patent Application No. 104133214.
Notice of Allowance mailed Nov. 25, 2014 for U.S. Appl. No. 13/727,737.
Notice of Allowance mailed Apr. 18, 2015 for U.S. Appl. No. 13/727,737.
Notice of Allowance mailed Jul. 27, 2015 for U.S. Appl. No. 13/727,737.
Non-Final Office Action mailed Feb. 29, 2015 for U.S. Appl. No. 14/795,090.
International Search Report and Written Opinion mailed Oct. 27, 2014 for PCT Application No. PCT/US2013/045713.
Taiwan Office Action mailed May 18, 2015, for TW Patent Application No. 102145385.
Xi Qin et al., "A 0-35dB Wideband Variable Gain Amplifier in 0.13μ CMOS," 2011 IEEE Int'l Symposium on Radio-Frequency Integration Technology (RFIT), Nov. 30, 2011-Dec. 2, 2011, pp. 61-64.
International Preliminary Report on Patentability mailed Jul. 9, 2015 for PCT Application No. PCT/US2013/045713.
Taiwan Notice of Grant, mailed Sep. 9, 2015, for TW Patent Application No. 102145385.
Notice of Allowance, mailed Oct. 24, 2016, for U.S. Appl No. 14/795,090.
Second Office Action for Chinese Patent Application No. 201380062024.3, issued on Jan. 20, 2017.

* cited by examiner

Table-1 Truth Table of the GPA Offset detection.

| Data[nT] | Edge[nT] | Data[(n+1)T] | Falling/Rising | Early(-1)/Late(+1) |
|---|---|---|---|---|
| L | L | L | Skipped | 0 |
| L | L | H | Rising | -1 |
| L | H | L | N/A | 0 |
| L | H | H | Rising | 1 |
| H | L | L | Falling | 1 |
| H | L | H | N/A | 0 |
| H | H | L | Falling | -1 |
| H | H | H | Skipped | 0 |

FIG. 9 where $Y_t = R_{eq} + j\omega(C_{gs} + C_{eq})$

| Data[n-1]T | Data[n]T | Edges[n]T | Data[n+1]T | Results | Early(-1)/Late(+1) |
|---|---|---|---|---|---|
| 0 | 0 | 0 | 0 | Skipped | 0 |
| 0 | 0 | 0 | 1 | xB | -1 |
| 0 | 0 | 1 | 0 | Skipped | 0 |
| 0 | 1 | 1 | 1 | xB | 1 |
| 0 | 1 | 0 | 0 | 1B | 1 |
| 0 | 1 | 1 | 1 | Skipped | 0 |
| 0 | 0 | 0 | 0 | 1B | -1 |
| 0 | 0 | 1 | 1 | Skipped | 0 |
| 1 | 0 | 1 | 0 | Skipped | -1 |
| 1 | 0 | 1 | 1 | 1B | 0 |
| 1 | 1 | 0 | 0 | 1B | 1 |
| 1 | 1 | 0 | 1 | xB | 1 |
| 1 | 1 | 1 | 0 | Skipped | 0 |
| 1 | 1 | 1 | 0 | xB | -1 |
| 1 | 1 | 1 | 1 | Skipped | 0 |

FIG. 17

| Data t = (n-1)T | Data t = nT | Edge t = nT | Data t = (n+1)T | Am-Error t = nT | Results | Early(-1)/ Late(+1) | 1-B Amplitd Big (+1)/Small(-1) |
|---|---|---|---|---|---|---|---|
| 0 | 0 | 0 | 0 | X | Skipped | 0 | X |
| 0 | 0 | 0 | 1 | X | xB | -1 | X |
| 0 | 0 | 1 | 0 | X | Skipped | 0 | X |
| 0 | 0 | 1 | 1 | X | xB | 1 | X |
| 0 | 1 | 0 | 0 | 0 | 1B | 1 | 0 |
| 0 | 1 | 0 | 1 | 1 | 1B | 1 | 1 |
| 0 | 1 | 1 | 0 | X | Skipped | 0 | X |
| 0 | 1 | 1 | 1 | 0 | 1B | -1 | 0 |
| 1 | 0 | 0 | 0 | 1 | 1B | -1 | 1 |
| 1 | 0 | 0 | 1 | X | Skipped | 0 | X |
| 1 | 0 | 1 | 0 | 0 | Skipped | -1 | 0 |
| 1 | 0 | 1 | 1 | 1 | 1B | -1 | 1 |
| 1 | 1 | 0 | 0 | X | 1B | 1 | X |
| 1 | 1 | 0 | 1 | 0 | 1B | 1 | 0 |
| 1 | 1 | 1 | 0 | 1 | Skipped | -1 | 1 |
| 1 | 1 | 1 | 1 | X | Skipped | 0 | X |

HIGH SPEED RECEIVERS CIRCUITS AND METHODS

CLAIM FOR PRIORITY

This application claims priority to U.S. patent application Ser. No. 14/795,090, filed on 9 Jul. 2015, titled "HIGH SPEED RECEIVERS CIRCUITS AND METHODS," which claims priority to U.S. patent application Ser. No. 13/727,737, filed on 27 Dec. 2012, titled "HIGH SPEED RECEIVERS CIRCUITS AND METHODS," and both of which are incorporated by reference in their entirety.

TECHNICAL FIELD

The present invention relates generally to high frequency receivers, and in particular, to gain-peaking amplifiers and equalization for high-frequency applications.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 9 shows a truth table for GPA offset detection in accordance with some embodiments.

FIG. 17 is a table showing UI binning criteria in accordance with some embodiments.

FIG. 18 shows a table showing UI binning criteria in accordance with some other embodiments.

DETAILED DESCRIPTION

Serial I/O interfaces are being driven at ever increasing rates. For example, chip;-to-chip channels may be operated at 28 Gb/s or even higher. Such channels have become more challenging for serial I/O designs because of the severe transmission-line loss and significant signal reflections. It can be particularly challenging to design and implement receiver amplifiers such as the gain peaking amplifiers (GPA) that are commonly used in high frequency serial I/O receivers. (A GPA may also sometimes be referred to as an CTLE, continuous-time linear equalization amplifier.)

Figure 1:
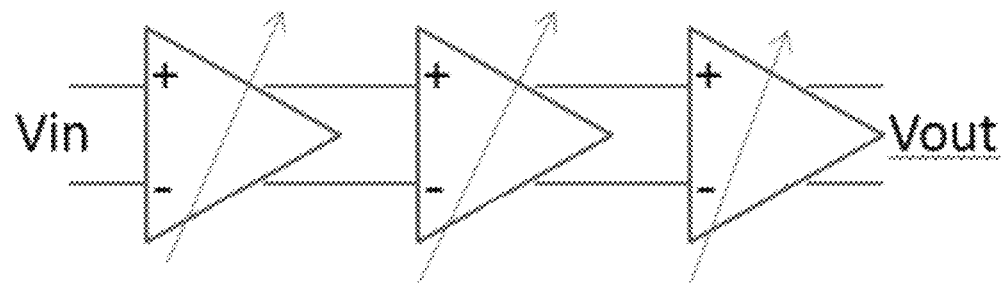
FIG. 1 shows a conventional composited gain peaking amplifier (GPA) with three cascaded stages.
Figure 2:
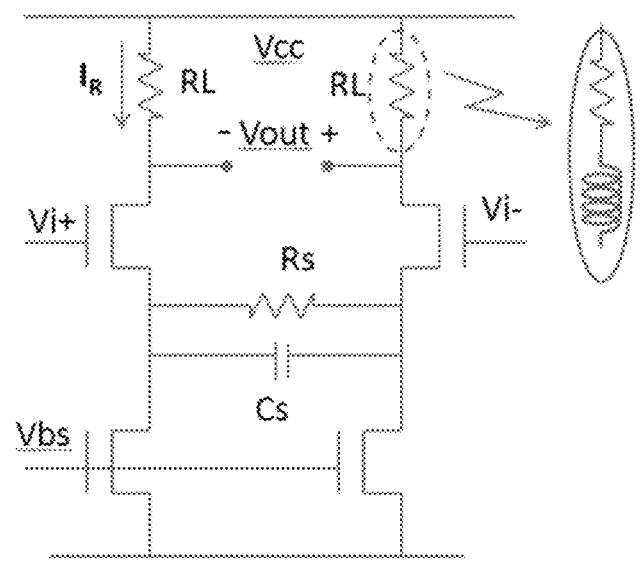
FIG. 2 shows a conventional gm-RL GPA stage for the composited GPA of FIG. 1.

FIG. 1 shows a conventional composited gain peaking amplifier (GPA) with three cascaded stages, and FIG. 2 shows a conventional GPA stage circuit implementation. As indicated in FIG. 2, such prior GPA solutions may be designed with a Gm-RL topology. Unfortunately, such circuits have several limitations. The available GPA Gain-Bandwidth product, an indication of the maximum speed capacity of an amplifier, is dominantly determined by the output RC time constant, i.e. RL*Cout, where Cout is the output loading and total parasitic. The transconductance (Gm or gm) is proportional to the square-root of the term, IR*W/L (W and L corresponding to a utilized transistor's width and length, respectively). Thus considerable increments in the bias current, IR, and device size, W/L, may be required to make a substantial gm change.

Moreover, RL is also limited by the condition of the output DC common-mode level to ensure the sufficient saturation margin of the differential pair amplifier (the output DC=Vcc−RL*IR). Two cascaded identical gain-stages give a bandwidth reduction of 36%, while three cascaded identical gain-stages give a bandwidth reduction of 48%.

For high frequency applications, designs have been modified (as indicated in FIG. 2) by replacing the RL with a series combination of the RL and an additional inductor. However, most of the afore mentioned drawbacks are still applied to this derivative gm-RL topology. Accordingly, new approaches may be desired.

Figure 3:
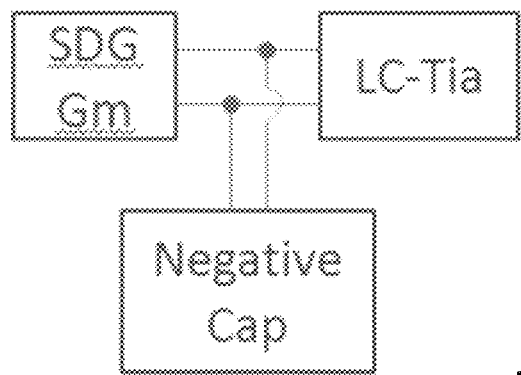
FIG. 3 is a diagram showing a single GPA gain stage in accordance with some embodiments.

FIG. 3 shows a GPA stage in accordance with some embodiments. This GPA circuit comprises a source-degenerative transconductance stage (SDG-Gm), a negative capacitance unit (Negative-Cap), and a trans-impedance stage with LC resonant circuits (LC-Tia), coupled as shown. The negative cap. unit in each stage serves to cancel capacitance on the inside node at the output of the SDG-Gm section, which allows for the gain of the amplifier stage to be boosted. This is in contrast, for example, with the prior art GPA stage of FIG. 2, which uses an output voltage RL load. A GPA stage with an inter-disposed negative cap unit instead uses a controlled device, e.g., NMOS device, as a current source with high output impedance.

Figure 4:
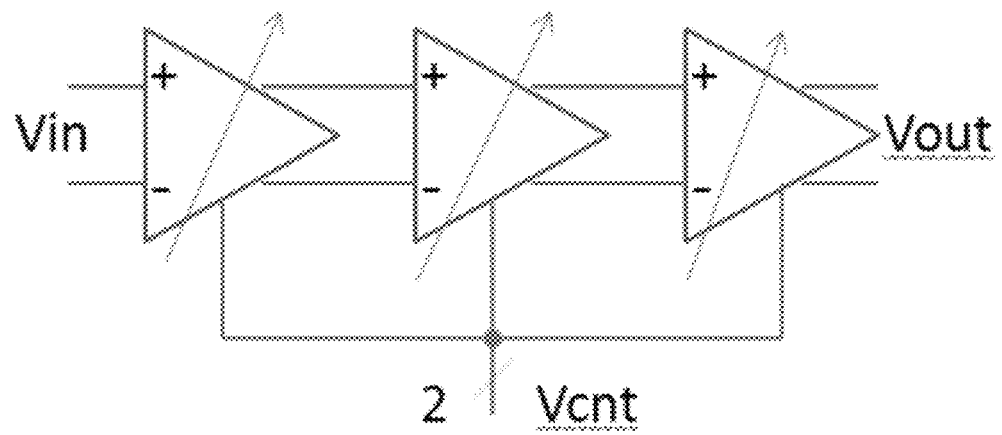
FIG. 4 shows a composited GPA amplifier formed from three cascaded GPA stages in accordance with some embodiments.

In order to achieve a large (if not a maximum) gain peaking performance, a composited GPA may be formed from two or more of these stages cascaded together. For example, FIG. 4 shows three of these stages cascaded together in a Cherry-Hooper amplifier topology with a control signal (Vcnt) for controlling a gain parameter for improving the overall gain-bandwidth response of the entire amplifier. So, the composited (Cherry-Hooper type) amplifier of FIG. 4 is different from an amplifier formed from simply cascading together three of the prior art GPA stages.

Figure 5:
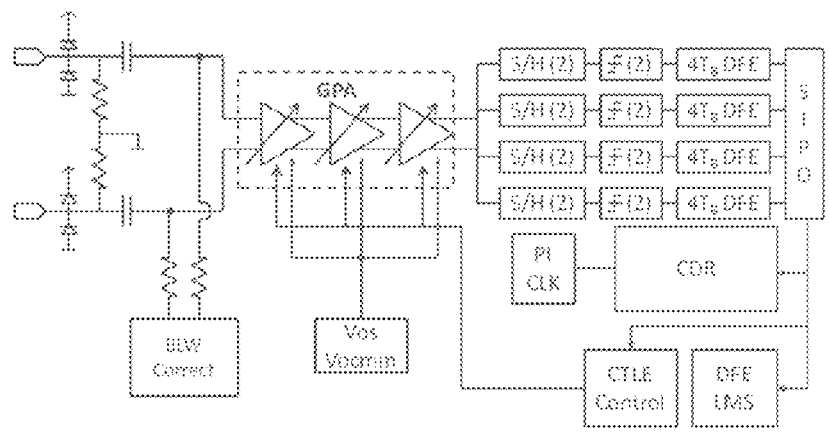
FIG. 5 shows a receiver with adaptive equalization and a composited amplifier such as the amplifier of FIG. 4 in accordance with some embodiments.

FIG. 5 is a block diagram of a receiver with speed-enhanced equalization techniques employing GPA stages with negative capacitance units and with offset and common-mode control, as disclosed herein. Functionally, a disclosed full speed gain-peaking amplifier (GPA) stage can provide the first stage of CTLE to better control opening of the data eyes and thus sustain the adequate manipulations in the subsequent digital equalization (e.g., DFE and CDR blocks). The GPA can be controlled to compensate for the generally low-pass frequency response characteristics of the incoming transmission channel and to mitigate against inter-symbol-interference (ISI) effects by boosting up the high-frequency intensity of the input data, but also, by suppressing the low frequency components where desired. Sufficient bandwidth and gain-peaking characteristics (i.e. gain magnitude and gain slopes versus frequency) may be employed for good GPA designs.

Figure 6:
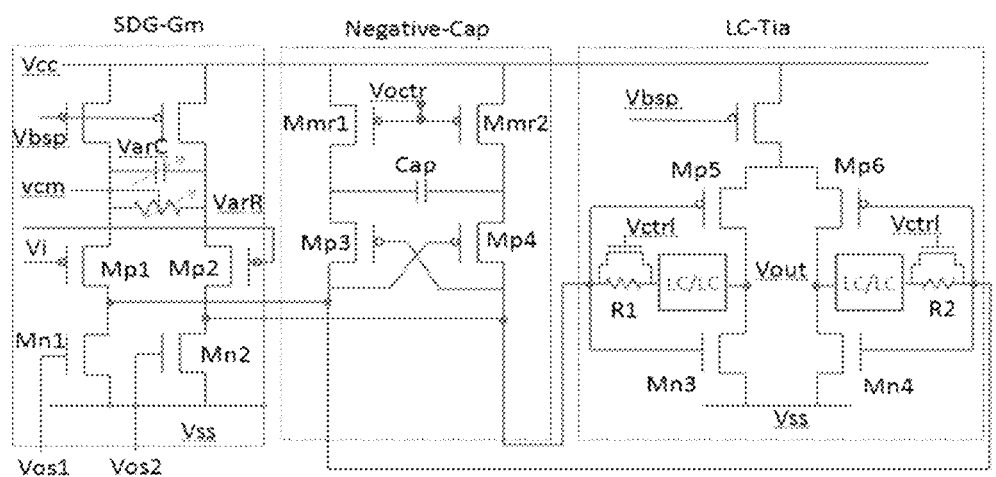
FIG. 6 is a circuit showing a GPA stage of FIG. 3 in greater detail in accordance with some embodiments.

FIG. 6 illustrates a possible circuit embodiment for a single GPA gain-stage of FIG. 3. Basically, the SDG-Gm and LC-Tia blocks are formed as an RC-degenerated amplifier with a Cherry-Hooper topology to support the high-frequency equalizations. The parallel negative-cap unit is used to minimize the parasitic capacitance between the SDG-Gm portion and the LC-Tia block, and it further boosts up the AC performance of the GPA gain-stage. The LC-LC blocks function as feedback elements for inverters formed from Mp5/Mn3 and Mp6/Mn4. They correspond to resonant circuits in series with one another (see, e.g., FIG. 11 for an exemplary IC chip implementation).

In the SDG-Gm block, the variable capacitance (VarC) and variable resistance (VarR) are both used to control the receiver equalization. A signal for controlling VarC determines the GPA AC gain-slope over the operating frequency band. It is typically desirable to generate an AC response that matches the inversed transfer-function of the transmission-line. The variable resistor (VarR) sets the lower-frequency gain and provides an adequate ratio of the maximum peak-gain to the lower-frequency gain. The probing terminal, vcm, between two resistor strings of the variable resistor network (VarR) is employed for output common-mode detection on the previous cascaded gain-stage.

As illustrated in the figure, the depicted negative-cap unit is formed from a cross-coupled NMOS circuit with a shunt capacitor. The neg. cap. unit serves to cancel out parasitic capacitance between the SDG-Gm and LC-Tia blocks. (See also FIGS. 12-14 for AC analysis of the negative-cap. unit, alone, and integrated into the SDG-Gm and LC-Tia blocks.)

The NMOS devices (Mn1 and Mn2) are biased at a nominal DC current, but on the other hand are also controlled by the terminals Vos1 and Vos2 to correct the output offset voltage at the Vout of the LC-Tia output port. This offset correction scheme is done primarily (if not always) as soon as possible when the power supply is turned up and the receiver is in a calibration mode.

In the negative-cap block, the two P-type current mirrors (Mmr1 and Mmr2) are used to bias the cross-coupled PMOS devices (Mp3 and Mp4) and are also used to adjust the DC level of the output common-mode voltage, Vout, at the LC-Tia output port. The Voctr signal controls the bias current of the negative-cap unit, and thus, controls the peaking gain and also the gain/bandwidth of the overall composite GPA amplifier.

In the LC-Tia block, a pair of CMOS inverters with local feedbacks (LC-LC across their inputs and outputs) is incorporated. The controlled resistor and a dual LC resonant circuit (e.g., the LC/LC unit of FIG. 11) are exploited in the feedback path for thermal and process-variation compensation and high-frequency gain peaking.

Figure 10A:
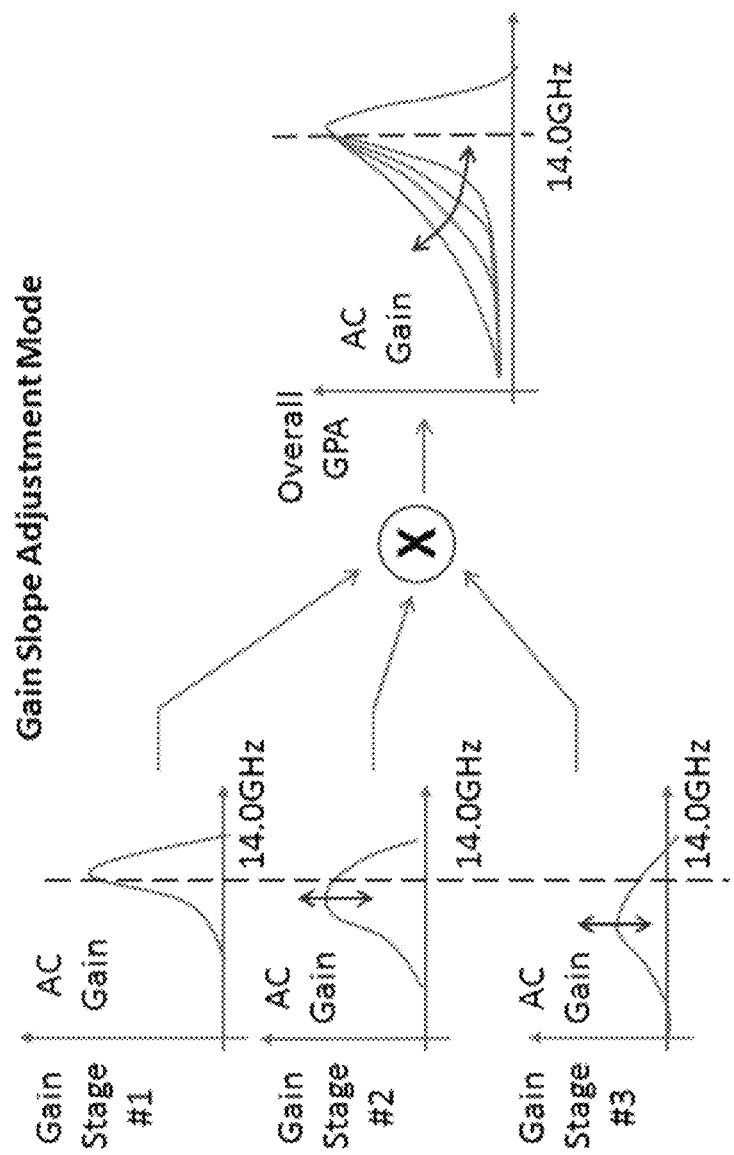
FIGS. 10A and 10B illustrate first and second modes for shaping frequency responses using a composite GPA in accordance with some embodiments.
Figure 10B:
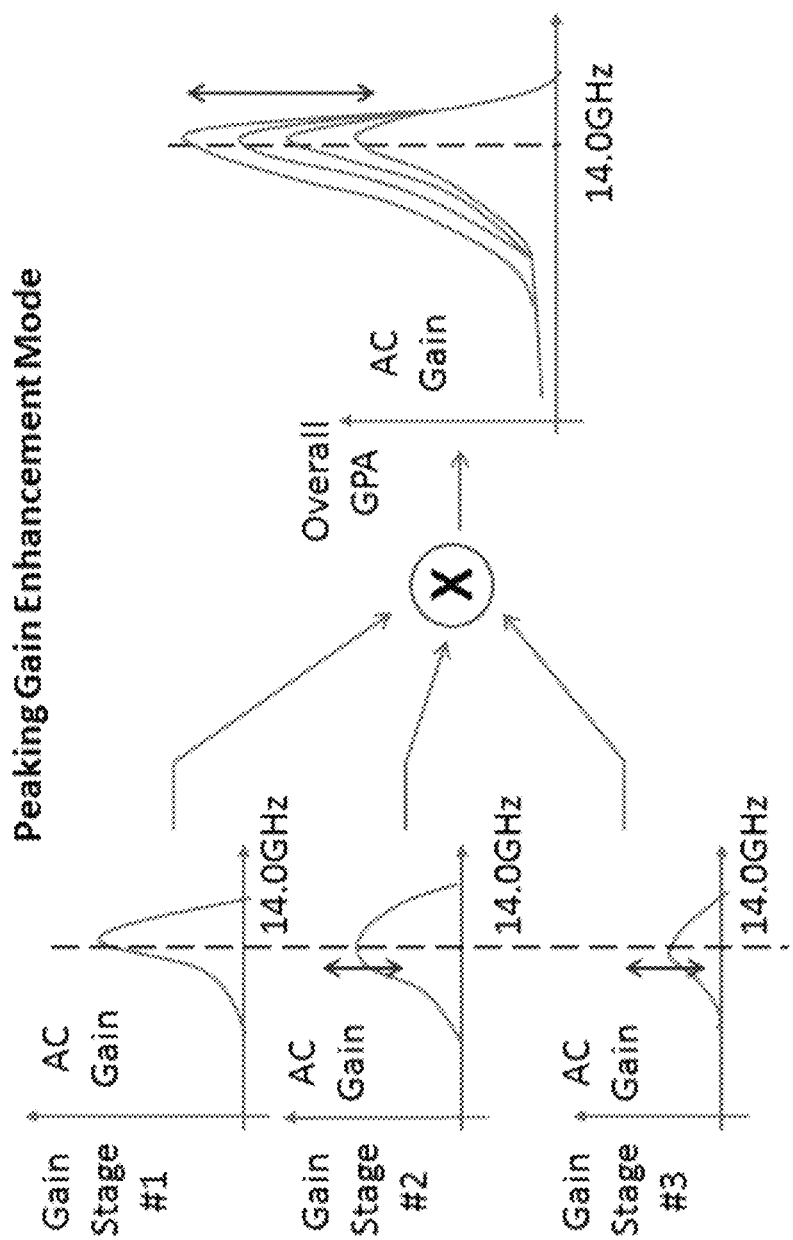

Different inductance and capacitance values may be chosen to obtain dual resonant frequencies at the LC/LC unit in order to broaden the gain-peaking characteristics for each of the GPA gain-stages. For the three-stage GPA, three different resonant frequencies of the LC/LC units are designed with three different values of LC combinations so that the overall AC gain-peaking characteristics can be optimized to match a desired inverse transfer-function of the transmission-line. (An illustration of such gain-peaking, showing contributions by each of the three cascaded gain-stages, can be seen in FIGS. 10A and 10B. FIG. 10A shows a first mode used to shape the transfer response of the composite GPA to inversely match the transmission line. FIG. 10B shows a second mode, which simply maximizes a target frequency region. Note that the dashed line (for the targeted peak-gain frequency) is shifted slightly to the left of the actual peak to account for PVT inconsistencies.)

Figure 11:
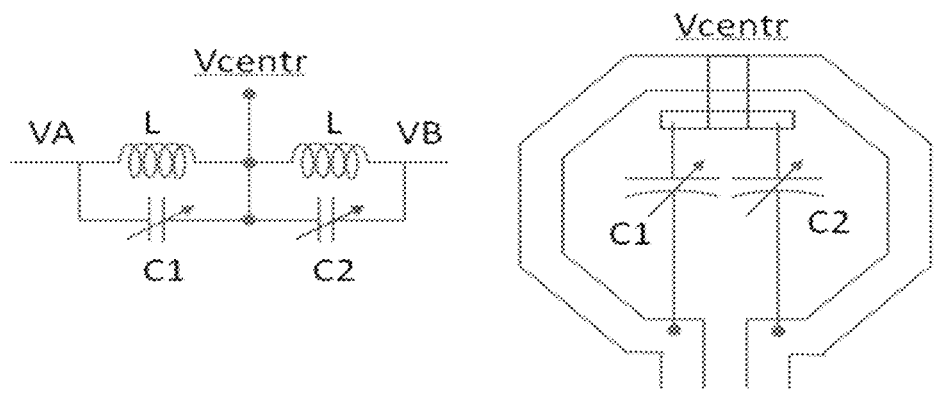
FIG. 11 shows a circuit layout implementation for an LC-LC dual resonance circuit in accordance with some embodiments.

In some embodiments, the LC-Tia block may be implemented with an LC/LC unit residing in the feedback path with a series resistor. To save the chip area, the two inductors in one individual LC/LC unit may be implemented with a single differential inductor template (e.g., a layout p-cell) as shown in FIG. 11. In this embodiment, each leg of the inductor is connected in parallel to the varactor C1 (or C2) as one-half of the dual resonant LC/LC circuit.

Figure 7:
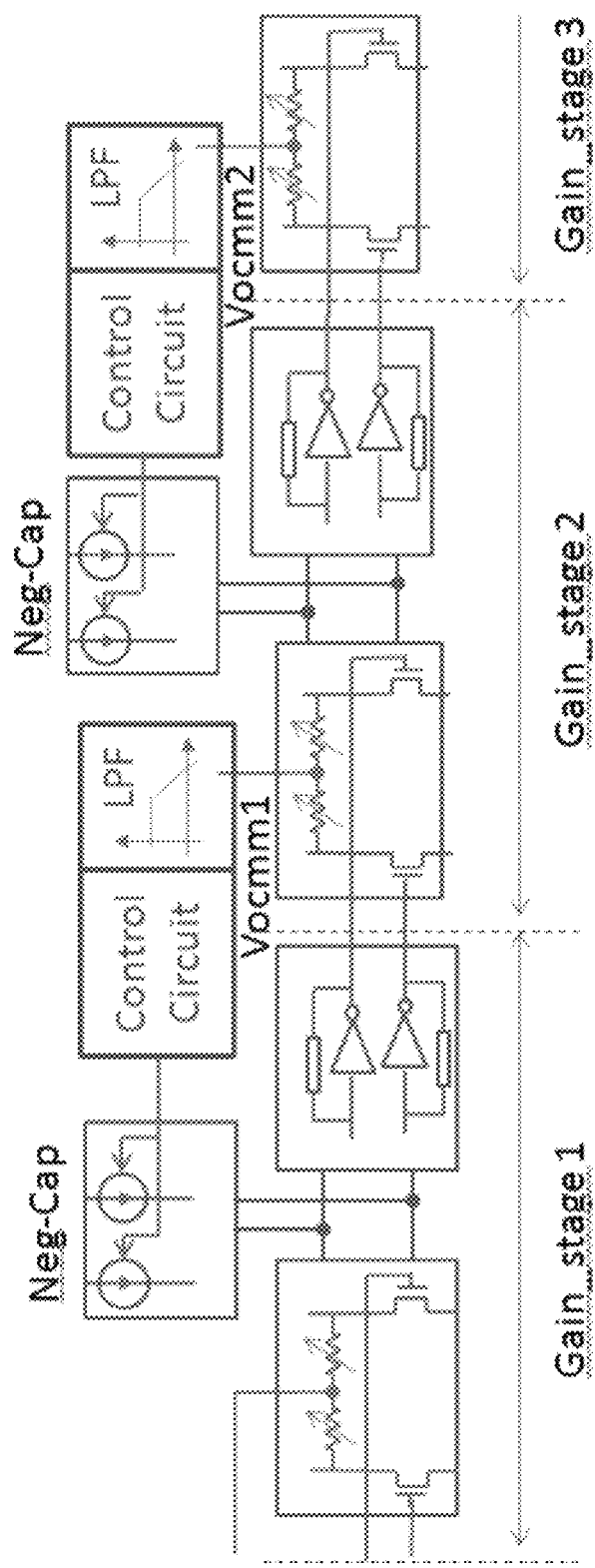
FIG. 7 is a diagram showing an offset control topology for GPAs in a composite amplifier in accordance with some embodiments.

FIG. 7 is a convenient representation of a composite GPA in accordance with some embodiments. It shows how the output common-mode voltage of each gain-stage may be detected over the three subsequent gain-stages of the composite amplifier. In some embodiments, the same differential-pair circuits may be re-used as part of the common-mode feedback network in order to avoid the extra loading on the high-speed data path. Shown in this figure, a DC control approach for the output common-mode stabilization may be used. This output common-mode feedback (CMFB) network may be designed based on (i) avoiding extra loading to the high-speed data path, and (ii) probing on a genuine circuit path without introducing errors of device mismatch caused by the use of additional CMFB circuitry. The offset voltage corrections can be done at the input port of the first gain-stage, or can be corrected at each individual gain-stage.

Figure 8A:
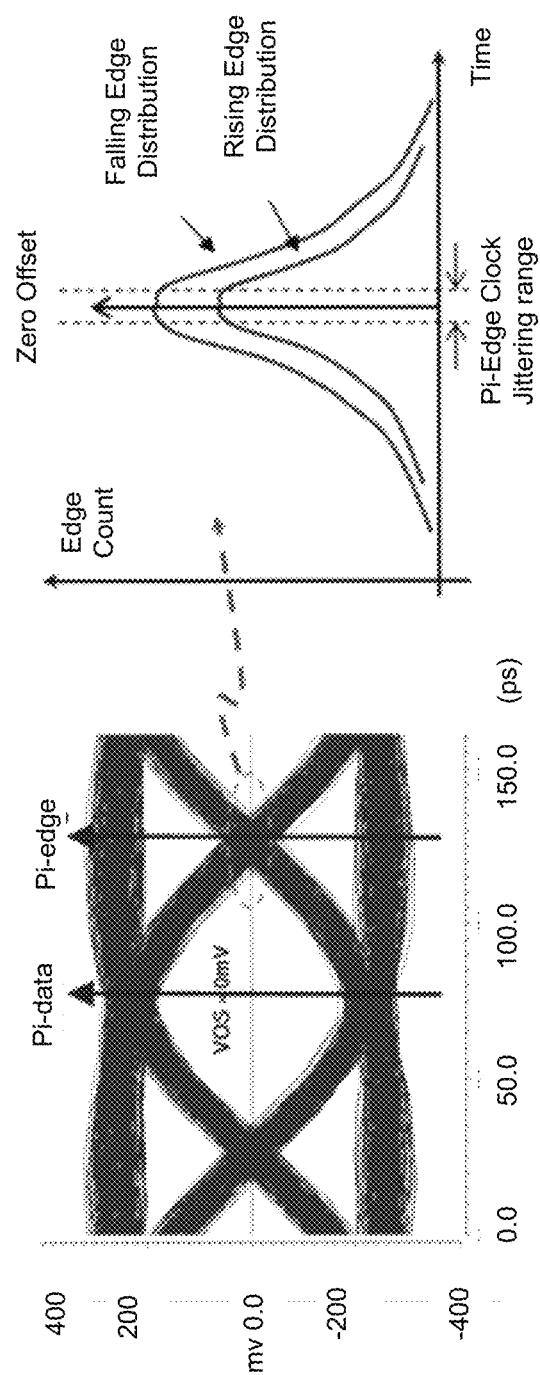
FIGS. 8A-8C are diagrams showing offset-voltage detecting concepts for controlling an offset control topology in accordance with some embodiments.
Figure 8B:
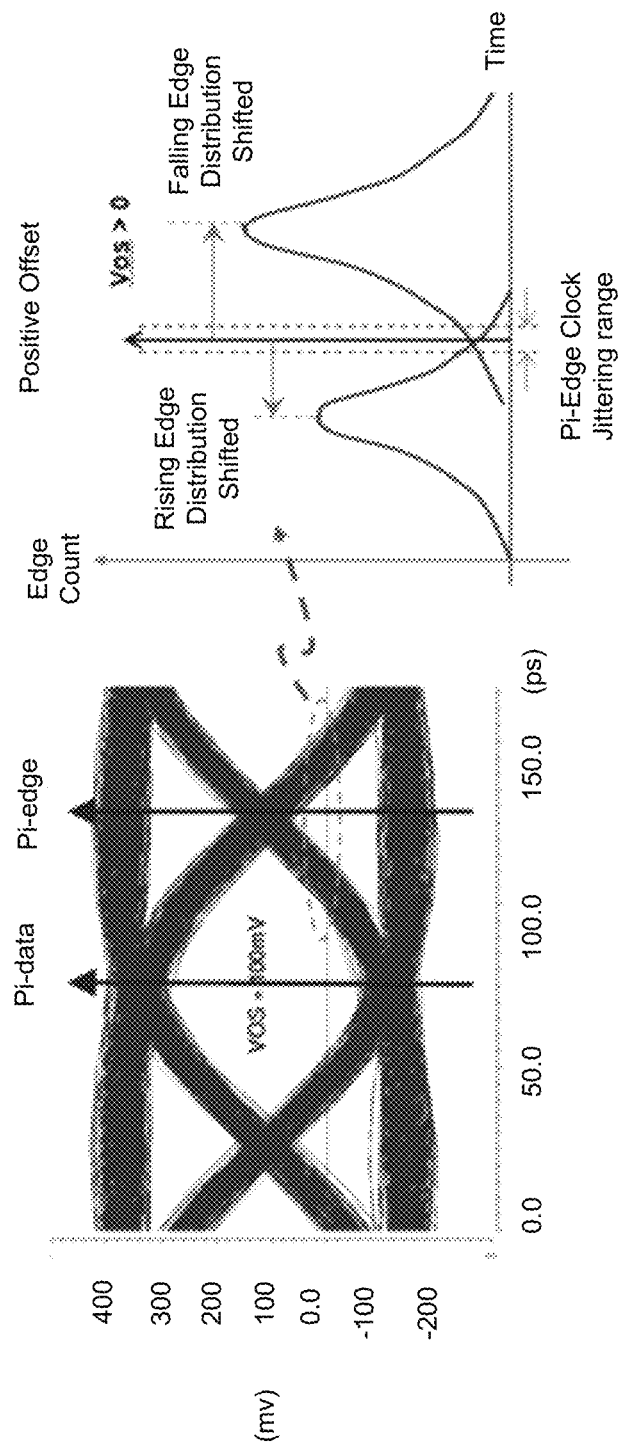
Figure 8C:
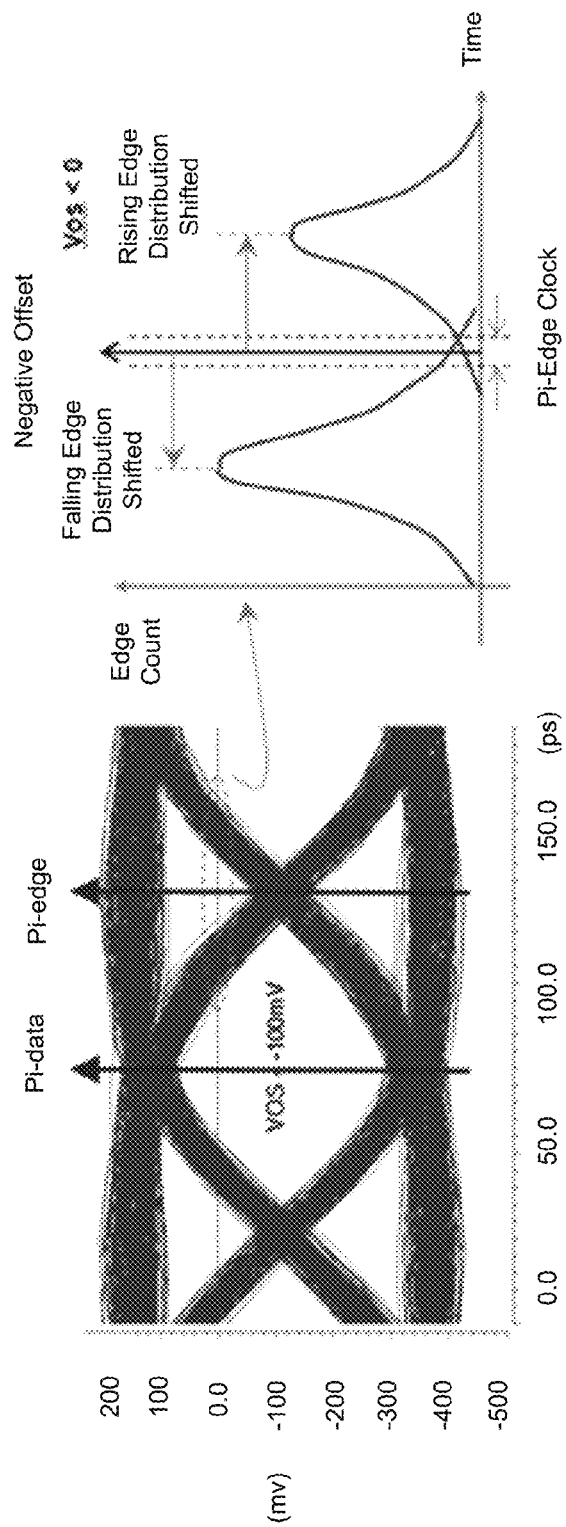

FIGS. 8A through 8C present offset-voltage detecting concepts. Basically, the individual stage offset correction is performed primarily (if not only) in a power-on calibration cycle for the receiver, wherein the output offset stage can be calibrated stage by stage. In a normal operation mode of the receiver, the real-time offset-voltage of the entire GPA may be detected at samplers using the approach of the data transition-edge (both rising/falling edges) distributions (presenting at the eye diagram). An offset control routine may be operated in a digital part of the receiver (or elsewhere) based on FIGS. 8A-8C to control offset (using Vos1, and Vos2 terminals in FIG. 6) to cause rising and falling edge distributions to sufficiently align, as shown in FIG. 8A. (The alignment routine determines the offset polarity based on the distribution analysis of the rising/falling edges versus the phase interpolated (PI) clock edges. The correcting signals (Vos1, and Vos2) may then be fed back to the input biasing circuitry for offset correction. This offset voltage correction control is intended to operate as a bang-bang scheme. The table of FIG. 9 is a truth-table for possible conditions of data transition-edges versus offset voltage polarities. With reference to FIGS. 6 and 7, the common-mode voltage is picked up at Vocmm1 and Vocmm2 and fed into a low pass filter (LPF). The common-mode control signal for a preceding stage is generated from the LPF output, from each subsequent stage, to control current levels in the negative cap units. A statistically analyzed distribution indicates if the offset is positive, resulting in the differential Vos1-Vos2 controlling the GPA stage to be more negative, and visa versa.

(Note that the one digital detection circuit (right-half section of FIG. 5) can be used both for offset correction, as discussed up to now, as well as for digital equalization, which is discussed later in this disclosure.)

Figure 12:
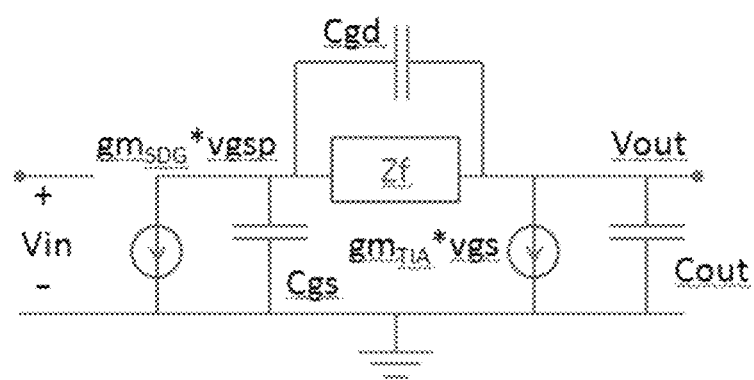
FIG. 12 shows an AC equivalent circuit for cascaded SDG-Gm and LC-Tia blocks in accordance with some embodiments.

With reference to FIG. 12, an AC analysis of the cascaded SDG-Gm and LC-Tia blocks, without including the negative-cap unit, will now be presented. The transfer function and the effective bandwidth can be derived as shown herein, beginning with the first order AC transfer function of the cascaded SDG-Gm and LC-Tia:

$$\frac{Vout}{Vin} = gm_{SDG} \cdot Zf - \frac{gm_{SDG}}{gm_{TIA}}$$

Where $$gm_{SDG} = \frac{gm_P}{1 + gm_P \cdot Z_{SDG}} \text{ and } gm_{TIA} = gm_{P2} + gm_{N2}$$

$$Z_f = R_f + \left(j\omega L_1 \| \frac{1}{j\omega C_1}\right) + \left(j\omega L_2 \| \frac{1}{j\omega C_2}\right)$$

$$Z_{SDG} = R_{SDG} \| \frac{1}{j\omega C_{SDG}}$$

$$\text{Noted: } A \| B = \frac{A \cdot B}{A + B}$$

An approximated effective bandwidth (dominant-pole) without including a negative-cap unit may be expressed as:

$$\omega \approx \frac{2gm_{TIA}}{C_{gs} + C_{out} + gm_{TIA} \cdot Z_f \cdot C_{gd}}$$

ω is less sensitive to Zf*Cout

Figure 13:
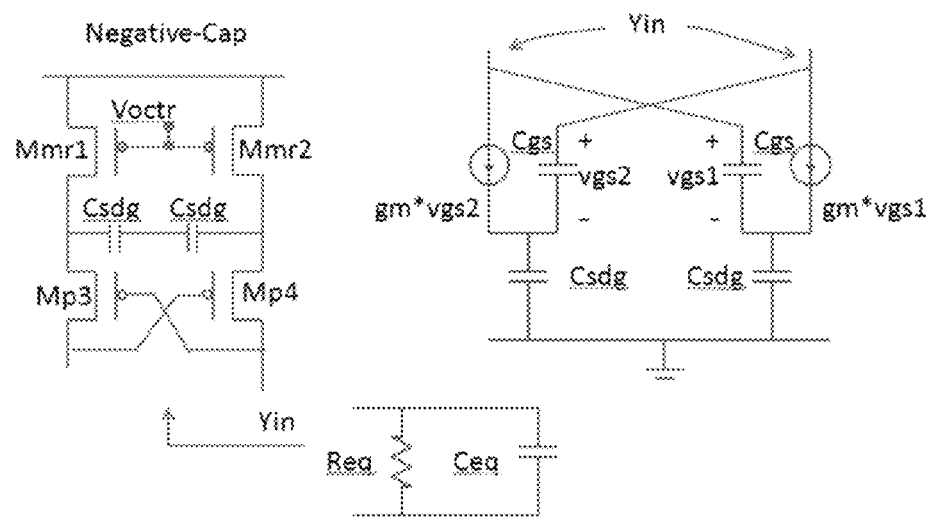
FIG. 13 shows an AC-equivalent circuit for a negative capacitance unit and an input admittance in accordance with some embodiments.

FIG. 13 shows an AC equivalent circuit for the negative-cap unit. The input admittance, Yin is derived and can be expressed as an equivalent resistance, Req, and an equivalent capacitance, Ceq. The input admittance, Yin=Req+Ceq, and Req, and Ceq can be express as follows:

$$R_{eq} = \frac{-2}{gm_P} \cdot \frac{1 + \left(\frac{\omega}{\omega_T}\right)^2 \left(1 + \frac{C_{sdg}}{C_{gs}}\right)^2}{\left(\frac{\omega}{\omega_T}\right)^2 \left(\frac{C_{sdg}}{C_{gs}}\right)\left(2 + \frac{C_{sdg}}{C_{gs}}\right)}$$

$$C_{eq} = \frac{C_{sdg}}{2} \cdot \frac{-1 + \left(\frac{\omega}{\omega_T}\right)^2 \left(1 + \frac{C_{sdg}}{C_{gs}}\right)}{1 + \left(\frac{\omega}{\omega_T}\right)^2 \left(1 + \frac{C_{sdg}}{C_{gs}}\right)^2} \text{ and}$$

$$\omega_T = \frac{gm_P}{C_{gs}}$$

Figure 14:
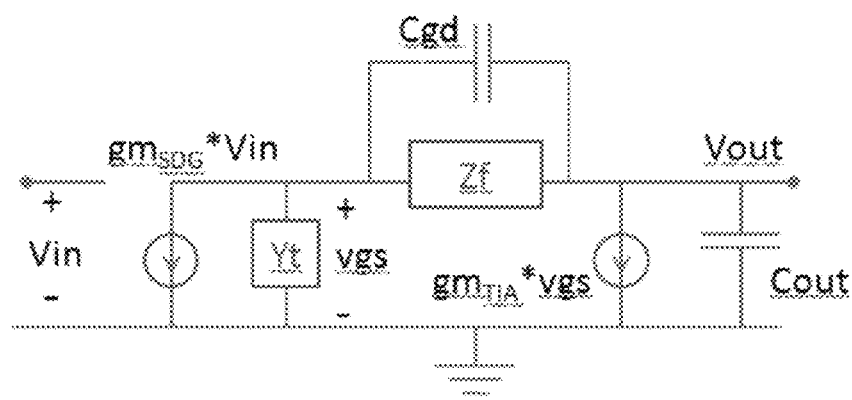
FIG. 14 shows an AC equivalent circuit for cascaded SDG-Gm and LC-Tia blocks with the negative capacitance unit included therewith in accordance with some embodiments.

FIG. 14 shows the two AC equivalent circuits combined. As can be seen, the AC performance for each individual GPA gain-stage can be improved because of the incorporated negative-cap unit. The Ceq reduces the parasitic of the total Cgs (of both PMOS, and NMOS, and also the other additional parasitic). In addition, the Req presents as a negative resistance which is also beneficial to decrease the input resistance of the LC-Tia, because the generated ac current signal from the SDG-Gm can be more efficiently coupled into the LC-Tia block. Therefore, the GPA gain-stage can be further enhanced in its AC performance with the incorporation of the negative-cap unit.

In some embodiments, disclosed composite GPA circuits, designed in Cherry-Hooper topologies, may have various benefits. For example, they can support data-rate operations of at least 28 GB/s because their effective bandwidths are less sensitive to output RC time constants. Therefore, such designs can be made as high bandwidth implementations, even though the Zf is designed as high impedance (or high resistance). In most cases, this will be an improvement as compared to conventional Gm-RL designs, in which the bandwidth is reversely proportional to the load (RL).

In addition, some designs may have a higher driving capability on a capacitive load. Some designs may also have less bandwidth reduction when their stages are cascaded. They also may have lower power consumption, e.g., because the designs may provide higher gain than previous designs, so there will be more margin for the trade-off between power consumption and AC gain.

Also, in some embodiments, there may be less frequency range with saturated gain. For example, the use of a double resonant LC/LC unit provides a pointing gain response. Therefore, the frequency region for the saturated-gain (small gain-slope region) may be substantially less than that of prior designs.

Also with some embodiments, there may be at least two available operational modes on the gain peaking adjustment. As shown in FIGS. 10A and 10B, two gain-peaking controlled modes are available in the receiver equalization design, providing more flexibility in high-speed receiver development. Moreover, with some designs, digital offset voltage detection, e.g. using statistical distributions of the data transition edges, offset voltage may be detection can be made in a digital domain, providing a feasible approach that can provide improved immunities against PVT variations. These and other benefits may be provided from various embodiments disclosed herein.

Digital Equalization Using Edge UI Binning

In the following sections and with respect to FIGS. 15-19, transition-edge binning techniques for digital equalization, e.g., for a composite GPA as discussed above, will now be discussed. Techniques discussed herein may be employed in receiver-based adaptive continuous-time linear equalizer (CTLE) amplifiers, such as the ones shown in FIGS. 5 and 15.

Figure 15:
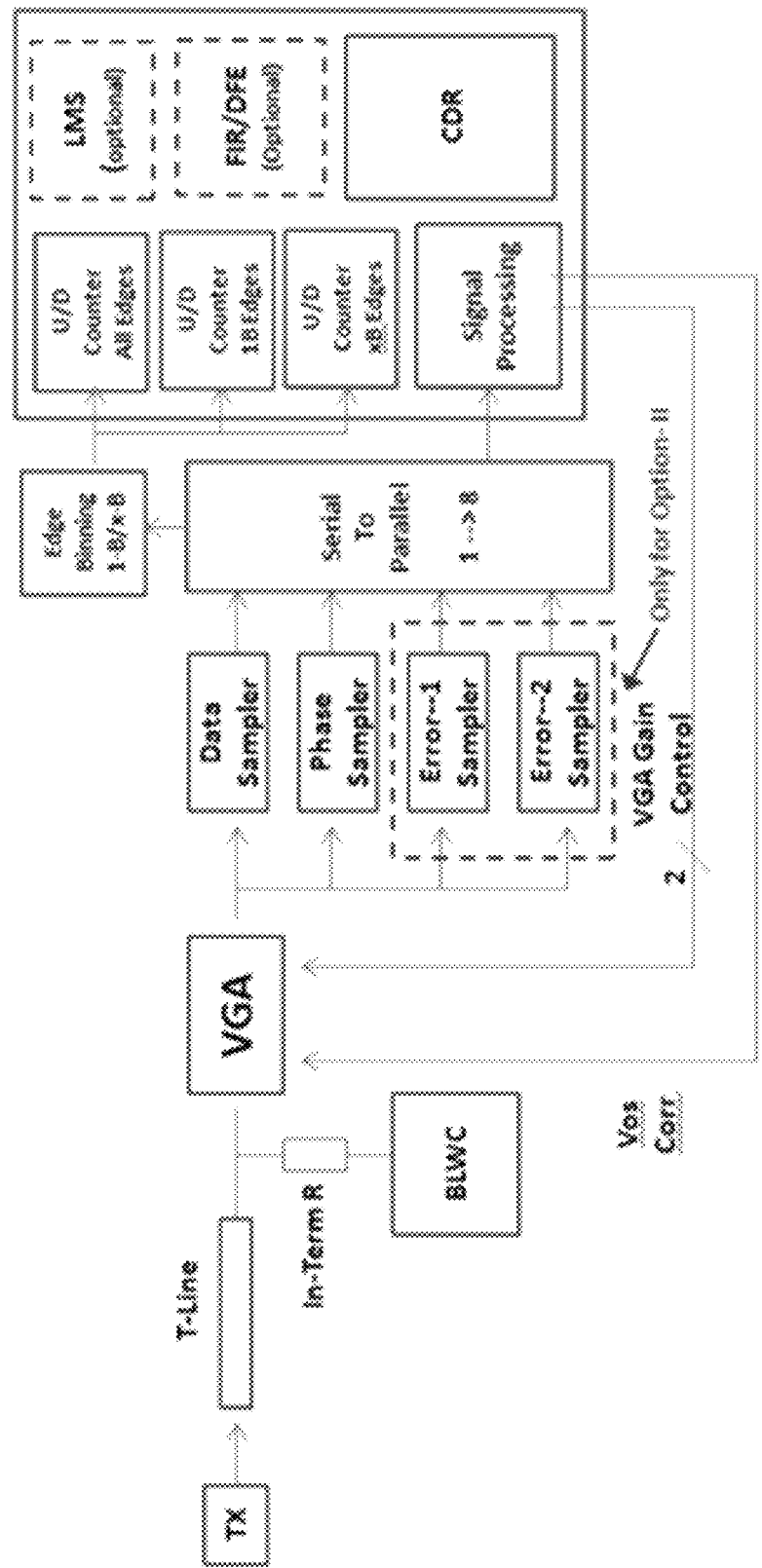
FIG. 15 is a diagram showing a receiver with a composite GPA and edge-equalization with binning in accordance with some embodiments.

FIG. 15 is a top-level block diagram showing equalization (EQ) approaches in accordance with some embodiments disclosed herein. In a first embodiment, edge-equalization in a CTLE configuration may require only one VGA gain control-loop, and in a second embodiment, edge-equalization in a CTLE structure may comprise two VGA gain control-loops, one with peak-gain control and the other with low-frequency gain control.

Since the first embodiment is also part of the second embodiment, it will primarily be described. With reference to FIG. 15, the basic operations of the edge equalization can be described in the following manner.

A transmitter (Tx) transmits the data signal through the channel (T-line) to the receiver or the VGA input. Due to the ISI effect, the eye diagram at the VGA input is degraded. In order to correctly process the incoming data signal from the Tx, signal equalization is required to enhance the eye opening, by compensating the high frequency components of the signal. A VGA with source-degeneration topology is used to perform the waveform conditioning function. The data signal is then enhanced on both of its amplitudes and transition-edge slopes, and in turn, the zero-crossing distributions of the pulse edges are also shifted.

With the depicted equalizer, a technique herein referred to as "binning" is employed. With binning, separate counters are used to count different data and edge samples that are characterized as 1 B (bit unit interval), XB, or otherwise. (A bit unit interval is the period for a single bit, i.e., the inverse of a detected, or presumed, bit rate. For example, if a 2.5 GB/s scheme is assumed, 1 B would be 40 pico-sec. So, if an edge is assessed as arriving 80 pico-seconds after the last edge, then it would be classified as a 2 B edge, a 160 pico-second edge would be a 4 B edge, and so on.) with the depicted digital detector, three up/down counters are used: one for 1 B edges, one for X (any integer) edges, and one for both 1 B and XB edges.

Figure 16A:
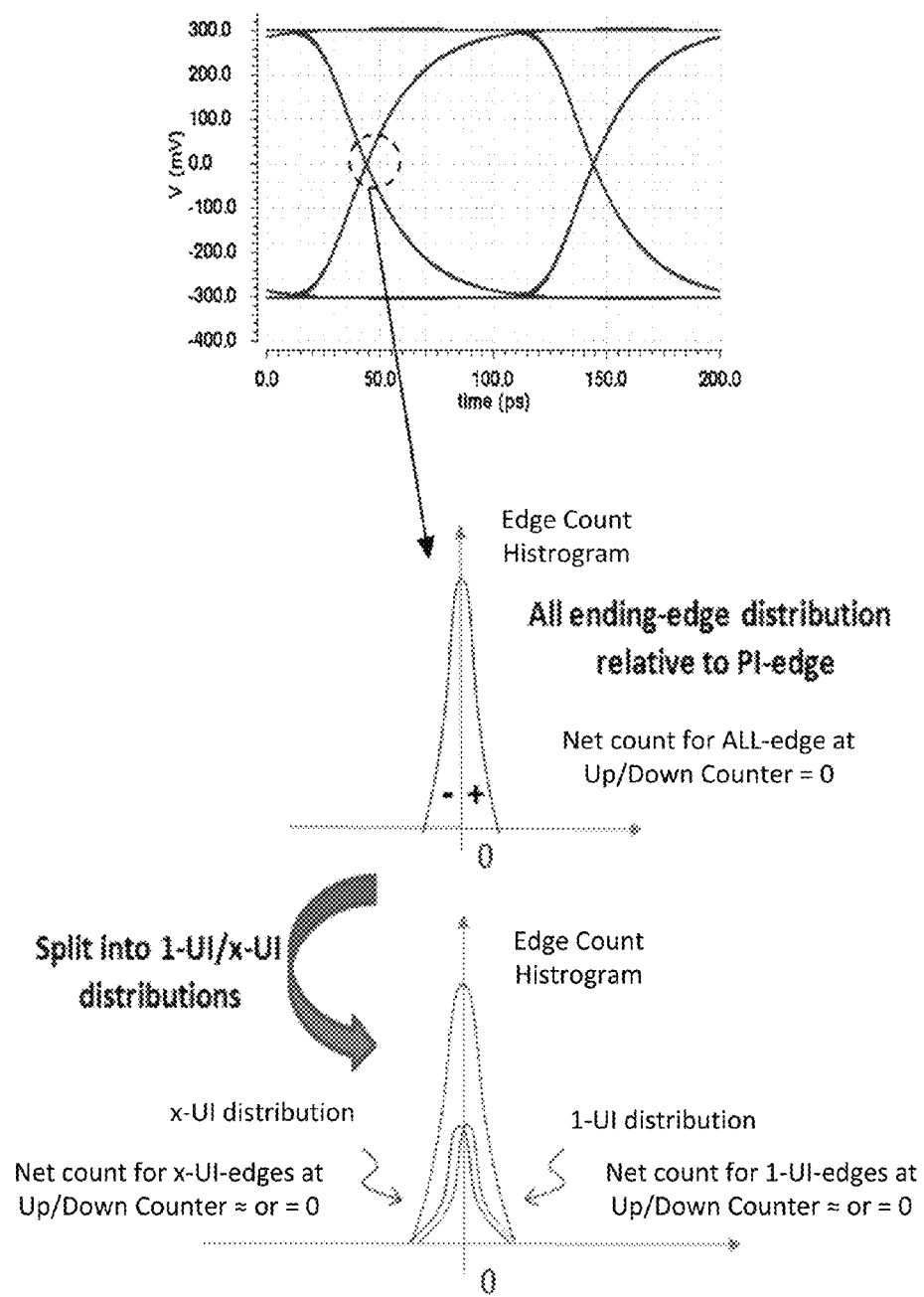
FIG. 16A is a diagram showing a zero-crossing histogram with a ideal equalization in accordance with some embodiments.
Figure 16B:
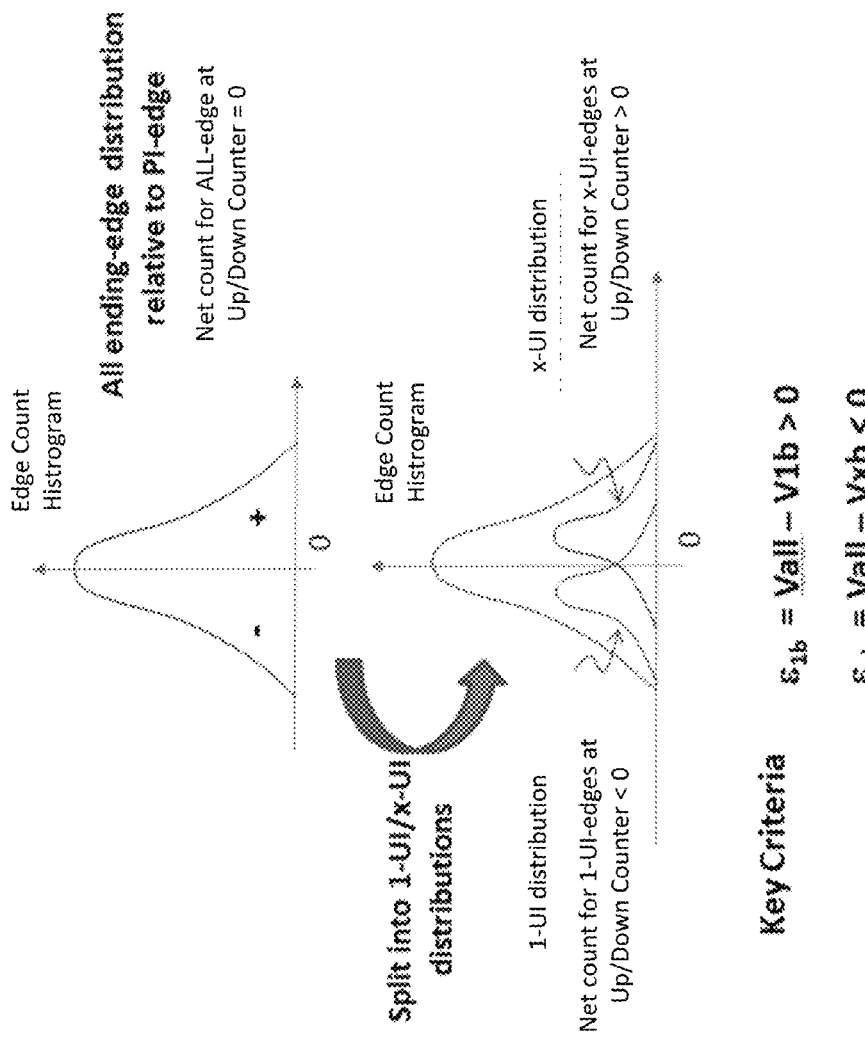
FIG. 16B is a diagram showing a zero-crossing histogram with excessive equalization in accordance with some embodiments.
Figure 16C:
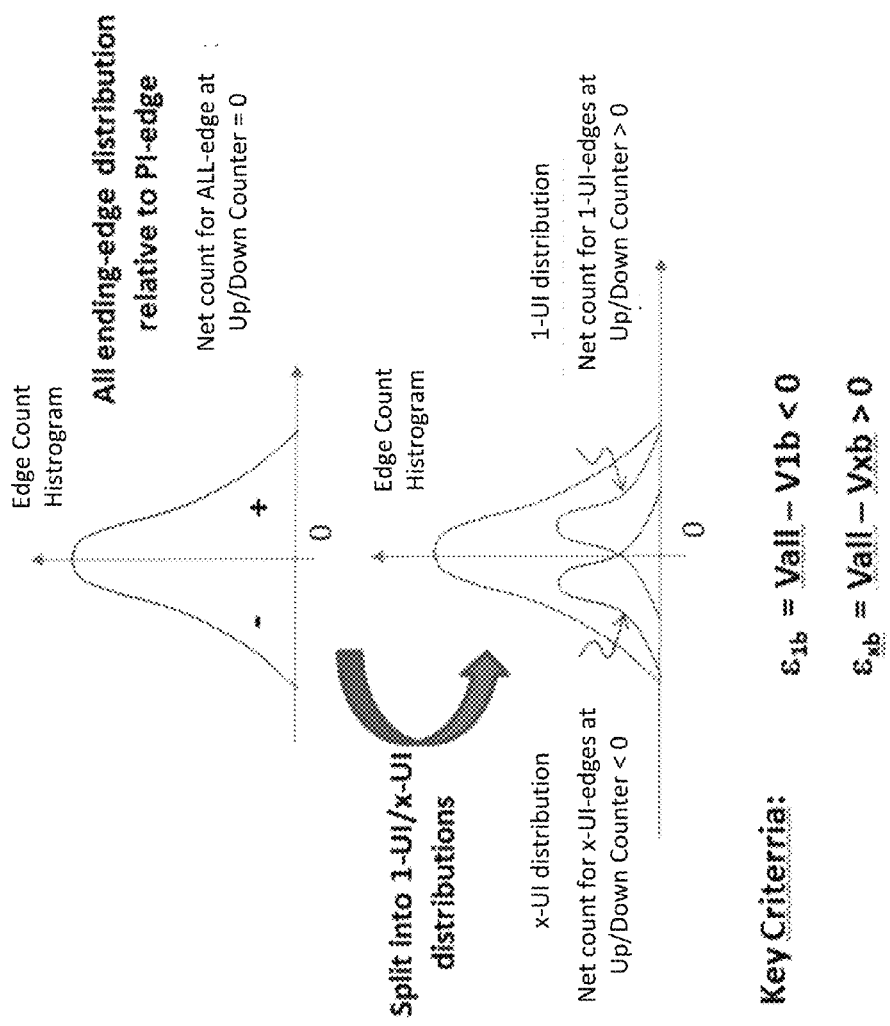
FIG. 16C is a diagram showing a zero-crossing histogram with insufficient equalization in accordance with some embodiments.

FIGS. 16A through 16C illustrate counted edge distributions for ideal equalization (16A), excessive equalization (16B) and insufficient equalization (16C). IN these distribution diagrams, falling edges, including edges from the 1-UI (1 B) pulses, the falling edges from the multi-UI (x-UI or XB) pulses other than 1-UI pulses, and the overall edges (All-UI) from any pulses (i.e. combination of the 1-UI and x-UI) are included.

When the eye-diagram is ideal (FIG. 16A), no equalization is needed, and the edge distributions of 1-UI, x-UI and All-UI will all be lined up with each other. The center of the All-UI distribution should also be aligned to the PI-edge clocks. Basically, this will remain true from a statistical view point, even though the phase of the PI clock is continuously adjusted by the CDR. If the detection outcome is assigned as "−1" for the earlier edges compared to the PI-edge clocks, and as "+1" for the later edge cases, the detected edge distributions can be quantized by using the up and down counters (UDC). Ideally, the up/down counters should give a 0-Count result for the All-UI edge distribution.

In FIGS. 16B and 16C, the edge distributions for different ISI conditions are illustrated. FIG. 16B shows the edge distribution in an over-equalized case where the UDC delta between All-UI and 1-UI, and also All-UI and x-UI, are highlighted as the criteria for the identification of an over-equalized condition for the CTLE loop. The detection criteria for identifying the under-equalized condition are similarly presented in FIG. 16C.

From the view points of the circuit operations, as shown in the block diagram of FIG. 15, two samplers are used (Data and Phase) for the sampling operations at the centers, and edges of the data pulses. The results of these samplers are then loaded into two registers for further processing.

The data and edge samples not only work as phase-detectors for CDR, but also determine the corresponding edge-occurrence timing relationship between data edges and the PI-edge clock. The table of FIG. 17 shows a truth table of this 1-UI versus X-UI binning criteria in accordance with some embodiments.

In afore mentioned second embodiment (two control loops), two additional amplitude-error samplers (Error-1 and Error-2 Samplers from FIG. 15) are incorporated. The corresponding binning criteria with the amplitude-error detection are shown in the table of FIG. 18.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The term "PMOS transistor" refers to a P-type metal oxide semiconductor field effect transistor. Likewise, "NMOS transistor" refers to an N-type metal oxide semiconductor field effect transistor. It should be appreciated that whenever the terms: "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. An apparatus comprising:
   a differential amplifier having a first transistor with a gate terminal to receive a first input signal, and a second transistor with a gate terminal to receive a second input signal;
   an offset cancellation circuit coupled to the differential amplifier; and
   a negative impedance circuit having a third transistor with a gate terminal coupled to a drain terminal of the first transistor, and a fourth transistor with a gate terminal coupled to the drain terminal of the second transistor.

2. The apparatus of claim 1, wherein the gate terminal of the third transistor is coupled to the drain terminal of the fourth transistor.

3. The apparatus of claim 2, wherein the gate terminal of the fourth transistor is coupled to the drain terminal of the third transistor.

4. The apparatus of claim 3 comprises a capacitive device coupled to source terminals of the third and fourth transistors.

5. The apparatus of claim 1 comprises a first resistive device coupled to the first transistor and a supply node.

6. The apparatus of claim 5 comprises a second resistive device coupled to the second transistor and the supply node.

7. The apparatus of claim 1 comprises a current source coupled to at least one of the source terminal of the first or second transistor.

8. An apparatus comprising:
   a first stage including a differential amplifier coupled to an offset cancellation circuit;
   a second stage coupled to the first stage, the second stage to reduce parasitic capacitance of one or more nodes of the first stage; and
   a third stage coupled to the second stage, wherein the third stage includes an amplifier.

9. The apparatus of claim 8, wherein the second stage includes a negative impedance circuit having cross-coupled transistors and a capacitive element coupled to the cross-coupled transistors, and wherein the negative impedance circuit is coupled to the differential amplifier.

10. The apparatus of claim 9, wherein the negative impedance circuit includes a current source coupled to the cross-coupled transistors.

11. The apparatus of claim 8, wherein the differential amplifier is coupled to a resistive element such that the resistive element is coupled to first and second input transistors of the differential amplifier.

12. The apparatus of claim 8, wherein an output of the differential amplifier is a differential output which is coupled to gate terminals of the cross-coupled transistors of the negative impedance circuit.

13. The apparatus of claim 8, wherein the differential amplifier and the negative impedance circuit are part of an analog front-end unit of a receiver.

14. A method to improve gain, the method comprising:
   receiving a differential input signal by a differential amplifier;
   cancelling offset of the differential amplifier; and
   reducing parasitic at one or more nodes of the differential amplifier by a negative impedance circuit.

15. The method of claim 14, wherein the negative impedance circuit includes cross-coupled transistors and a capacitive element coupled to the cross-coupled transistors, wherein the negative impedance circuit is coupled to the differential amplifier.

16. The method of claim 14 comprises amplifying an output of the negative impedance circuit.

17. The method of claim 14, wherein the differential amplifier and the negative impedance circuit are part of an analog front-end unit of a receiver.

18. The method of claim 14, wherein the output of the differential amplifier is a differential output which is coupled to gate terminals of the cross-coupled transistors of the negative impedance circuit.

19. The method of claim 14, wherein the negative impedance circuit includes a current source coupled to the cross-coupled transistors.

20. An apparatus comprising:
   a differential amplifier having an offset cancellation circuit;
   a negative impedance circuit to reduce parasitic capacitance of one or more nodes of the differential amplifier; and
   an amplifier coupled to the negative impedance circuit.

21. The apparatus of claim 20, wherein the negative impedance circuit includes:
   cross-coupled transistors and a capacitive element coupled to the cross-coupled transistors, and wherein the negative impedance circuit is coupled to the differential amplifier; and
   a current source coupled to the cross-coupled transistors.

22. The apparatus of claim 20, wherein the differential amplifier is coupled to a resistive element such that the resistive element is coupled to first and second input transistors of the differential amplifier.

23. The apparatus of claim 20, wherein an output of the differential amplifier is a differential output which is coupled to gate terminals of the cross-coupled transistors of the negative impedance circuit.

24. A computing platform, comprising:
   a first integrated circuit (IC) having a transmitter to send a bit stream;
   a transmission media; and
   a second IC coupled to the first IC via the transmission media, the second IC from a second IC having a receiver which is to receive the bit stream, wherein the bit stream is to provide a first input signal and a second input signal, and wherein the receiver comprises:
      a differential amplifier having an offset cancellation circuit and first and second transistors with corresponding gate terminals to receive the first and second input signals;
      a negative impedance circuit to reduce parasitic capacitance of one or more nodes of the differential amplifier; and
      an amplifier coupled to the negative impedance circuit.

25. The computing platform of claim 24, wherein the negative impedance circuit includes cross-coupled transistors and a capacitive element coupled to the cross-coupled transistors, and wherein the negative impedance circuit is coupled to the differential amplifier.

26. The computing platform of claim 24, wherein the differential amplifier, the negative impedance circuit, and the amplifier are part of an analog front-end unit of the receiver.

* * * * *